(12) United States Patent
Rislov

(10) Patent No.: US 12,100,989 B2
(45) Date of Patent: Sep. 24, 2024

(54) POWER STRIP WITH INTEGRATED AUTOMATIC TRANSFER SWITCH

(71) Applicant: ZONIT STRUCTURED SOLUTIONS, LLC, Boulder, CO (US)

(72) Inventor: Chadwick Rislov, Berlin (DE)

(73) Assignee: Zonit Structured Solutions, LLC, Boulder, CO (US)

( * ) Notice: Subject to any disclaimer, the term of this patent is extended or adjusted under 35 U.S.C. 154(b) by 379 days.

(21) Appl. No.: 17/351,615

(22) Filed: Jun. 18, 2021

(65) Prior Publication Data
US 2021/0313829 A1    Oct. 7, 2021

Related U.S. Application Data

(63) Continuation of application No. PCT/EP2019/085178, filed on Dec. 13, 2019.

(51) Int. Cl.
*H02J 9/06* (2006.01)
*H01R 13/70* (2006.01)
(Continued)

(52) U.S. Cl.
CPC .............. *H02J 9/06* (2013.01); *H01R 13/70* (2013.01); *H01R 25/003* (2013.01); *H05K 7/1492* (2013.01)

(58) Field of Classification Search
CPC ......... H02J 9/06; H01R 13/70; H01R 25/003; H05K 7/1492
See application file for complete search history.

(56) References Cited

U.S. PATENT DOCUMENTS

| | | | |
|---|---|---|---|
| 7,208,850 B2 * | 4/2007 | Turner | H01R 25/003 307/64 |
| 8,605,091 B2 * | 12/2013 | Bradbury | H01R 13/6691 709/200 |

(Continued)

FOREIGN PATENT DOCUMENTS

| | | |
|---|---|---|
| DE | 102018010000.7 | 12/2018 |
| WO | WO 2020/126937 A1 | 6/2020 |

OTHER PUBLICATIONS

International Search Report issued in co-pending International Application No. PCT/EP2019/085178, European Patent Office, dated Feb. 6, 2020, 3 pages.

(Continued)

*Primary Examiner* — Carlos Amaya
(74) *Attorney, Agent, or Firm* — Davis Graham & Stubbs LLP

(57) ABSTRACT

The present application relates to relates to a power strip in a server cabinet that can accommodate a plurality of devices and distribute power to the accommodated devices. The power strip includes an inlet connectable to the first power source for receiving the first power, one or more first outputs, one or more second outputs, and an automatic transfer switch integrated into the power strip. The automatic transfer switch is provided with a first input and a second input. The one or more second outputs are connected to the inlet for receiving and outputting the first power. The first input of the automatic transfer switch is connected to the inlet for receiving the first power. The second input of the automatic transfer switch is connectable to a second power source for receiving a second power. The automatic transfer switch automatically switches between the first input and the second input to connect one of the first input and the second inputs to the one or more first outputs of the power strip.

9 Claims, 5 Drawing Sheets

(51) Int. Cl.
    *H01R 25/00*    (2006.01)
    *H05K 7/14*     (2006.01)

(56)  References Cited

U.S. PATENT DOCUMENTS

| | | | |
|---|---|---|---|
| 8,994,213 B1 | 3/2015 | Czamara et al. | |
| 9,997,957 B2 * | 6/2018 | Chapel | H02J 9/061 |
| 10,474,220 B2 * | 11/2019 | Pachoud | H02J 9/06 |
| 2002/0105230 A1 | 8/2002 | Ziegler et al. | |
| 2011/0068625 A1 | 3/2011 | Duan et al. | |
| 2018/0278086 A1 * | 9/2018 | Hall | H01R 25/003 |

OTHER PUBLICATIONS

Written Opinion issued in co-pending International Application No. PCT/EP2019/085178, European Patent Office, dated Feb. 6, 2020, 5 pages.

* cited by examiner

POWER STRIP WITH INTEGRATED AUTOMATIC TRANSFER SWITCH

TECHNICAL FIELD

The present application relates to an electricity distribution system. In particular, the present application relates to a power strip in a server cabinet that can accommodate a plurality of devices and distribute power to the accommodated devices.

TECHNICAL BACKGROUND

Servers, network switches, telecommunication equipment and other electronic is devices are commonly used in computer rooms and data centres of diverse sizes. To power the devices, a server cabinet has been widely used to accommodate the devices and distribute power to the accommodated devices. Various methods, such as using a busbar with tap-off devices and individual cables, are provided to bridge power to the server cabinet.

Once power has been delivered to the server cabinet, the power is again split and distributed via one or more power strips. In the present application, the term power strip is interchangeable with the term power distribution unit and represents a unit provided in a server cabinet or an electrical distribution system for distributing power The power strips may be provided with a wide variety of shapes and sizes depending on the power requirements, number of outlets, monitoring and breaker requirements. Normally, a server cabinet is provided with two power strips, each for a respective power feed. In higher density cabinets, there could be more than two power strips in a server cabinet. Although most server cabinets have two power strips for two power feeds, it is not necessary that all the devices of the server cabinet are equipped with dual power supplies. For example, one of the devices may be connected to only one single power strip for a single power supply. In this case, the device loses power if there is a power failure of the single power strip to which the device is connected. This causes a problem that the devices having a single power supply may easily lose power.

The conventional art provides an automatic transfer switch to prevent the above-mentioned problem of a device having one single power supply. In general, an automatic transfer switch includes two inputs, each connected to a respective power source, and is able to automatically switch between the two inputs. The automatic transfer switch is arranged before the single power supply devices and may provide one or more outputs to be connected to the single power supply devices. By switching between the two inputs, the automatic transfer switch ensures that, when there is a power failure on one of the two inputs, the connected single power supply devices continue to receive power from the remaining one of the two inputs.

For server cabinets, the management of inner space is important in terms of increasing density of accommodated devices and improving air-cooling efficiencies. In this aspect, it is noted that the conventional automatic transfer switch takes valuable and limited cabinet space where devices may be accommodated. It is therefore desirable to provide a method for arranging the automatic transfer switch and the devices in the server cabinet in an efficient way.

SUMMARY OF INVENTION

In view of the above conventional problem, it is an object of the present application to provide a power strip and a system for improving efficiencies of a server cabinet by increasing density of accommodated devices and air-cooling efficiencies. The present application therefore provides the following means for solving the problem.

A power strip according to the present invention and a system for distributing a first power and a second power according to the present invention are described herein.

In an aspect of the present invention, a power strip is provided with an inlet connectable to the first power source for receiving the first power, one or more first outputs, one or more second outputs, and an automatic transfer switch integrated into the power strip. The automatic transfer switch is provided with a first input and a second input. The one or more second outputs are connected to the inlet for receiving and outputting the first power. The first input of the automatic transfer switch is connected to the inlet for receiving the first power. The second input of the automatic transfer switch is connectable to a second power source for receiving a second power. The automatic transfer switch automatically switches between the first input and the second input to connect one of the first input and the second inputs to the one or more first outputs of the power strip.

In another embodiment, one of the first input and the second input may be pre-set to be connected to the one or more first outputs of the power strip by the automatic transfer switch. The other of the first input and the second input is connected by the automatic transfer switch to the one or more first outputs of the power strip when there is a power failure of the power received by the pre-set one of the first input and the second input.

The automatic transfer switch may further include a switch mechanism for automatically switching between the first input and the second input. The switch mechanism automatically switches to connect the other one of the first input and the second input to the one or more first outputs of the power strip in response to the power failure of the first power.

In another embodiment, the power strip may further include a monitoring system. The monitoring system is powered by the first input and the second input and is configured to monitor the first power at the first input and the second power at the second input. The monitoring system may include a voltmeter or a current transformer for monitoring a voltage or a current of the first input and the second input. Preferably, the monitoring system monitors a voltage at the first input and a voltage at the second input to decide whether there is a power failure. Thereby, the power failure can be determined even when there is no load at the first output.

The monitoring system may remain powered by one of the first input and the second input when a voltage at the other one of the first input and the second input is no longer detected by the monitoring system. The monitoring system may be further configured to provide a notification when a voltage at the first input or a voltage at the second input is no longer detected by the monitoring system. The notification may indicate a failure of the first power when the voltage at the first input is no longer detected by the monitoring system, or the notification may indicate a failure of the second power when the voltage at the second input is no longer detected by the monitoring system.

By using both the first input and the second input to power the monitoring system, the monitoring system can remain powered even when there is a power failure in the first power source or the second power source. The power strip can thus continue to monitor the first input and the second input without providing an additional power source for the monitoring system.

In another embodiment, the power strip may further include a connector. The connector is connected to the inlet of the power strip, the second input of the automatic transfer switch, and, if a monitoring system is provided, the monitoring system. The second input of the automatic transfer switch is connectable to the second power source through the connector. Preferably, the connector is a locking connector capable of accomplishing a secure connection between the second input of the automatic transfer switch and the second power source.

By Integrating the automatic transfer switch into the power strip, the power strip is able to power single power supply devices by simply connecting the single power supply devices to the first outputs of the power strip. There is no need to provide both an automatic transfer device and power strips for each single power supply device. Moreover, the automatic transfer device which usually takes valuable space does not need to be provided at a position between the power strip and the second power source where the devices are usually accommodated in a server cabinet. The power strip thus allows for arranging the devices in the server cabinet in an efficient way and thereby improves the density of accommodated devices and the air-cooling efficiencies.

In another aspect of the present invention, a system is provided for distributing a first power from a first power source and a second power from a second power source to a plurality of devices. The system includes a power strip as described above for receiving the first power, as a first power strip, and further includes a second power strip for receiving the second power. The second power strip includes an inlet for receiving the second power and one or more third outputs for outputting the second power. The second input of the automatic transfer switch of the first power strip for receiving the first power is connected to the inlet of the second power strip for receiving the second power.

In another embodiment of the system, the first power strip for receiving the first power includes a first connector connected to the inlet of the first power strip and the second power strip for receiving the second power includes a second connector connected to the inlet of the second power strip. The first connector connects the second input of the automatic transfer switch of the first power strip to the second connector of the second power strip. Thereby, a connection is formed between the first power strip and the second power strip to provide the second power to the automatic transfer switch of the first power strip. Preferably, one of the first connector and the second connector is a locking connector capable of establishing a secure connection. Still preferably, both the first connector and the second connector are locking connectors capable of establishing secure connections.

In another aspect of the present invention, a method is provided for distributing first power from a first power source and a second power from a second power source to a plurality of devices. The method includes providing a power strip according to the present invention as described above. The method further includes connecting the inlet of the power strip to a first power source and connecting the second input to a second power source. The method further includes switching the automatic transfer switch to connect one of the first input and the second input to the one or more first outputs of the power strip.

In another embodiment of the present invention, the method may include pre-setting and connecting one of the first input and the second input to the one or more first outputs of the power strip. The method further includes switching the automatic transfer switch to connect the other one of the first input and the second input to the one or more first outputs of the power strip when there is a power failure of the first or second power received by the pre-set one of the first input and the second input.

Other aspects and advantages of the present invention can be seen on review of the drawings, the detailed description and the claims, which follow.

DETAILED DESCRIPTION

The embodiments will further be described with reference to the schematic diagrams illustrated in the figures. It is to be understood that there is no intention to limit the present invention to the specifically disclosed structural embodiments and methods. Preferred embodiments are described to illustrate the present invention, not to limit its scope, which is defined by the claims.

Figure 1:
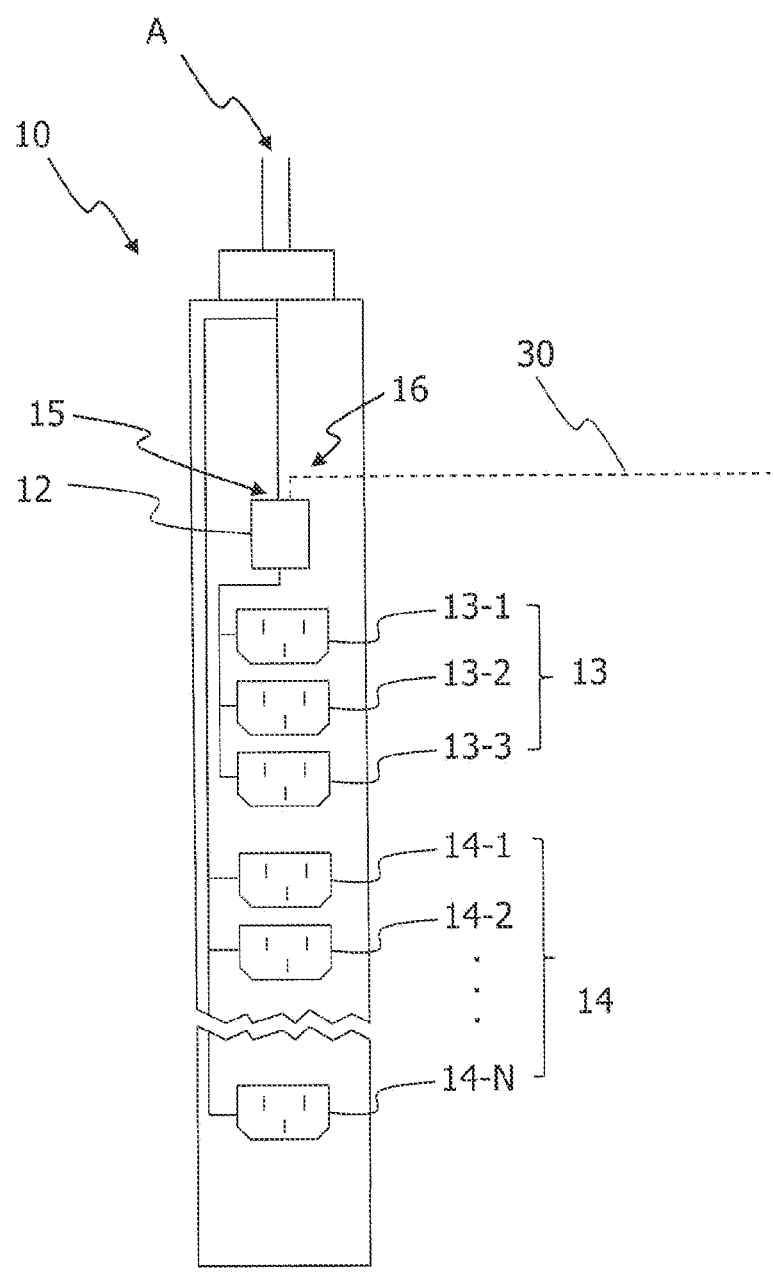
FIG. 1 is a schematic diagram of an embodiment of a power strip.

FIG. 1 illustrates an embodiment of a power strip 10 according to the present invention. The power strip 10 may be used as a first power strip 10 in an electrical distribution system. The first power strip 10 includes an inlet A for receiving a first power from a first power source. For example, the inlet A can be connected to a cable and a busbar that are provided to bridge the first power to the server cabinet. The first power strip 10 may be a power distribution unit having two types of outputs, the first outputs 13 and the second outputs 14. The second outputs 14 are connected to the inlet A of the first power strip 10. The second outputs 14 are thus able to provide the first power received by the first power strip 10 to connected devices.

In FIG. 1, the first outputs 13 include three outputs 13-1, 13-2, 13-3 and the second outputs 14 include more than three outputs 14-1 to 14-N. Nevertheless, the number of the first outputs 13 and the number of the second outputs 14 are only exemplary. There may be only one first output 13, two first outputs 13, or more than three first outputs 13 on the first power strip 10. Similarly, there may be only one second output 14 on the first power strip 10. The number of the first outputs 13 and the number of the second outputs 14 can be modified according to the design of the server cabinet and the devices accommodated therein. For example, there are normally only a few single power supply devices in a server cabinet. Thus, the number of the first outputs 13 can be less than the number of the second outputs 14.

The first power strip 10 is further provided with an automatic transfer switch 12 integrated into the first power strip 10. The automatic transfer switch 12 has a first input 15 and a second input 16. The first input 15 is connected to the inlet A of the first power strip 10 for receiving the first power. The second input 16 is connectable to a second power source via an interconnecting cable 30. An automatic transfer switch 12 may include an electrically operated switch, such as solid-state relays and electromagnetic latching relays, or a mechanically operated switch. The automatic transfer switch 12 is configured to switch between the first input 15 and the second input 16 to connect one of the first input 15 and the second input 16 to the first outputs 13 of the first power strip 10. As an example, the automatic transfer switch 12 may perform the switch in response to a power failure of the first power or the second power. As another example, the automatic transfer switch 12 may perform the switch in response to a signal indicating a power failure of the first power or the second power. Thereby, the first outputs 13 are able to receive power from either the first input 15 or the second input 16 via the automatic transfer switch 12.

As an example for switching between the first input 15 and the second input 16, the first input 15 may be pre-set as a primary input and connected to the first outputs 13. The first outputs 13 therefore receive the first power from the first input 15 and are able to provide the first power to connected devices. When there is a power failure of the first power, the automatic transfer switch 12 automatically switches to connect the second input 16 to the first outputs 13. In this case, the first outputs 13 are able to provide the second power received via the interconnecting cable 30 to the connected devices. As another example, the second input 16 may be pre-set by the automatic transfer switch 12 as a primary input to be connected to the first outputs 13. The first input 15 thus serves as a secondary input and is connected to the first outputs 13 when there is a power failure of the second power.

By means of the power strip 10 as described above, a device equipped with dual power supplies can be powered by the second outputs 14 of the first power strip 10 and another power source. On the other hand, when a device equipped with a single power supply is provided, it can be powered by the first outputs 13 of the first power strip. In this case, depending on the setting of the automatic transfer switch 12, the device equipped with a single power supply may receive one of the first power and the second power as a primary power and receive the other one of the first power and the second power as a secondary power. If there is a power failure of the primary power, the automatic transfer switch 12 automatically switches to provide the secondary power to the device equipped with a single power supply. Thereby, the single power supply device continues to receive power when there is a power failure of one power source. The power strip 10 according to the present invention is thus able to power both single power supply devices and multiple power supply devices.

In particular, by integrating the automatic transfer switch 12 into the first power strip 10, the power strip 10 is able to power single power supply devices by simply connecting the single power supply devices to the first outputs 13 of the first power strip 10. As a result, the automatic transfer device which usually takes valuable space does not need to be provided at a position between the power strip and the second power source where the devices are usually accommodated in a server cabinet. Moreover, there is no need to provide both an automatic transfer device and power strips for each single power supply device. Therefore, the power strip according to the present invention allows for arranging the devices in the server cabinet in an efficient way and thereby improves the density of accommodated devices and air-cooling efficiencies. By integrating an automatic transfer switch 12 into a power strip 10, the automatic transfer switch 12 and the power strip 10 are formed in a single enclosure.

For example, the automatic transfer switch 12 can be mounted into the power strip 10 by screwing, clipping, gluing, moulding, or equivalent ways of integration.

Figure 2:
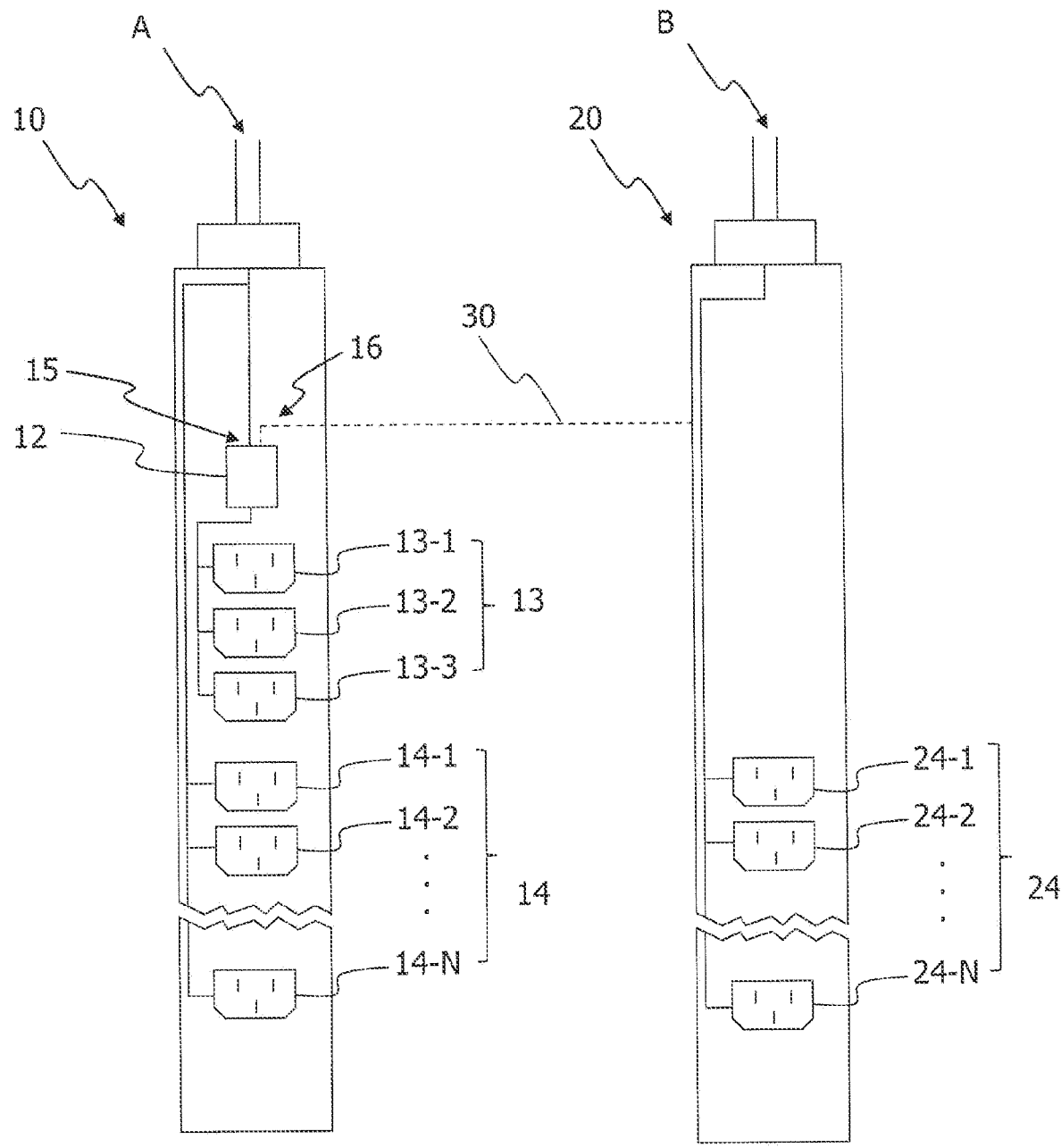
FIG. 2 is a schematic diagram of an embodiment of a system including the power strip illustrated in FIG. 1.

FIG. 2 illustrates an embodiment of a system including the power strip as described above with reference to FIG. 1. The system illustrated in FIG. 2 further includes a second power strip 20 for receiving a second power. The first power strip 10 and the second power strip 20 are normally accommodated inside a server cabinet (not shown). Nevertheless, the first power strip 10 and the second power strip 20 can also be arranged outside a server cabinet. In FIG. 2, the first power strip 10 and the second power strip 20 are shown in a vertical manner. Nonetheless, the first power strip 10 and the second power strip 20 can also be arranged in different manners, such as in a horizontal way, in a server cabinet.

In the embodiment illustrated in FIG. 2, the second power strip 20 corresponds to a conventional power strip. The second power strip 20 includes outputs 24 connected to the inlet B for outputting the second power received by the second power strip 20. Referring to the first power strip 10 in FIG. 2, the second input 16 of the automatic transfer switch 12 is connected to the inlet B of the second power strip 20 and thereby receives the second power. By means of the first power strip 10 and the second power strip 20, the system is able to distribute the first power and the second power to both single power supply devices and multiple power supply devices.

For powering a single power supply device, the single power supply device can be simply connected to the first outputs 13 of the power strip 10. There is no need for arranging an automatic transfer switch at a position between the two power strips where the single power supply devices are normally located. Therefore, the system of FIG. 2 is able to avoid interference in the valuable and limited cabinet space where devices are accommodated.

Figure 3:
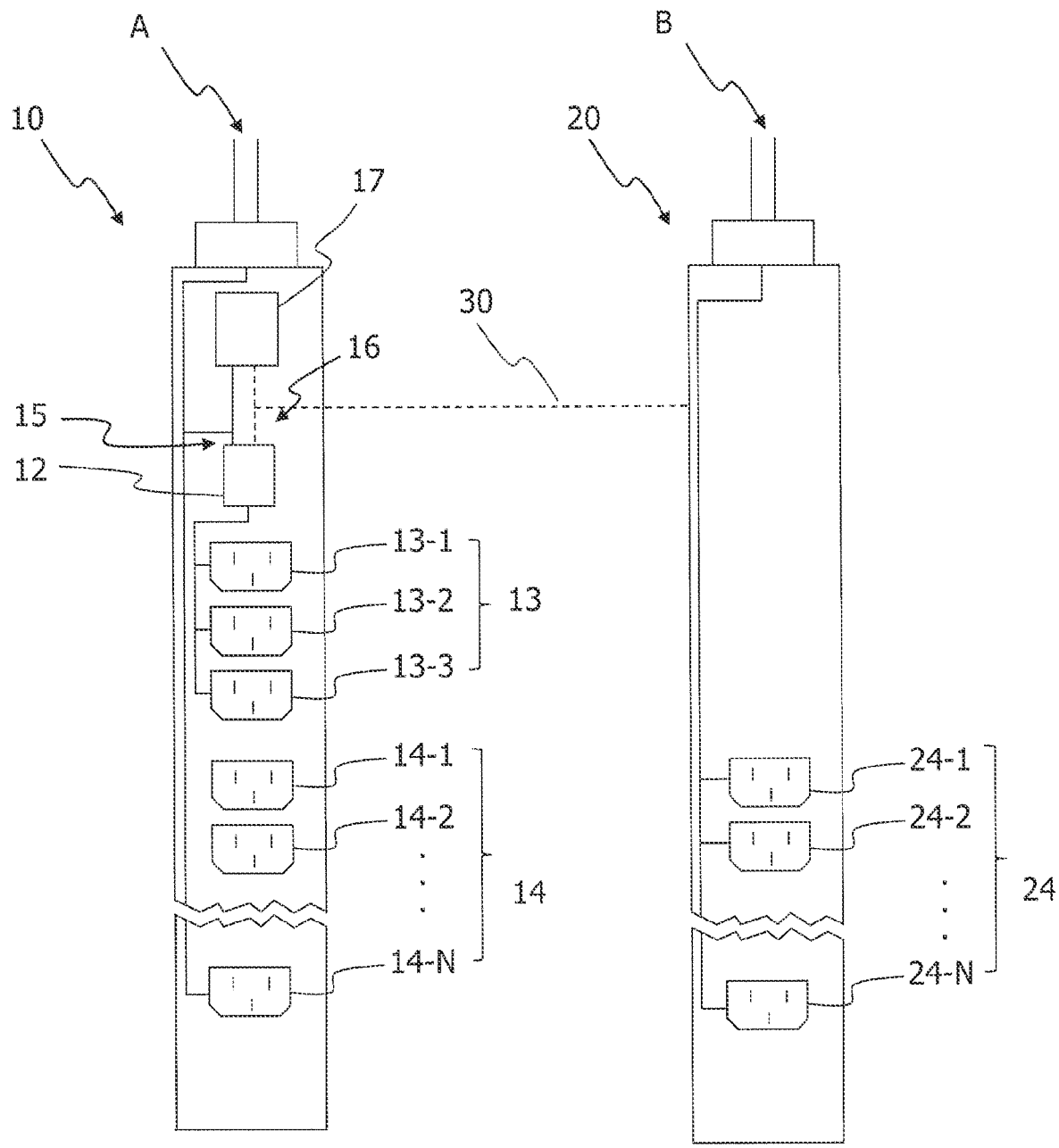
FIG. 3 is a schematic diagram of another embodiment of a power strip and a system.

FIG. 3 illustrates another embodiment of a system and a power strip according to the present invention. For the sake of simplicity, like elements are provided with like reference numerals as used in FIG. 1 and FIG. 2.

Similar to the embodiment of FIG. 1, the power strip 10 according to the embodiment of FIG. 3 includes first outputs 13, second outputs 14, and an automatic transfer switch 12 and may be used as a first power strip in an electrical distribution system. The power strip 10 according to the embodiment of FIG. 3 differs from the embodiment of FIG. 1 in that the power strip 10 further includes a monitoring system 17.

As illustrated in FIG. 3, the monitoring system 17 is connected to the first input 15 and the second input 16 of the power strip 10. The first input 15 is connected to the inlet A of the first power strip 10 and the second input 16 is connectable to the inlet B of the second power strip 20. Thereby, the monitoring system 17 can be powered by the first power source at the first input 15 and the second power source at the second input 16.

The monitoring system 17 may include a voltmeter for measuring a voltage at the first input 15 and a voltage at the second input 16. The monitoring system 17 may also include or be connected to a device, such as a current transformer, for measuring a current at the first input 15 and a current at the second input 16. By measuring a current or voltage at the first input 15 and the second input 16, the monitoring system 17 may decide whether there is a power failure. Preferably, the monitoring system 17 decides a power failure when a voltage at the first input 15 or a voltage at the second input 16 is no longer detected by the monitoring system 17. Thereby, the power failure can be determined even when there is no load at the first output 13. The monitoring system 17 is further configured to provide a notification when a power failure is determined. As an example, the monitoring system 17 provides a notification indicating a failure of the first power when a voltage at the first input 15 is no longer detected and provides a notification indicating a failure of the second power when a voltage at the second input 16 is no longer detected. In addition to measuring a voltage or current at the first input 15 and the second input 16, the monitoring system 17 can also be configured to measuring a voltage, current, temperature or other physical/electrical properties at the second outputs 14, individual second outputs 14-1 to 14-N, the inlet A, or at other location of the system.

As explained above, the monitoring system 17 can be powered by the first input 15 and the second input 16. The monitoring system 17 can thus remain powered by the second input 16 when a power failure occurs at the first input 15. When a power failure occurs at the second input 16, the monitoring system 17 can also remain powered by the first input 15. For example, when a voltage at the second input 16 is no longer detected, the monitoring system 17 can still be powered by the first power at the first input 15 and continue to monitor the power at the first input 15 and the power at the second input 16. Thereby, the monitoring system 17 can remain powered even when there is power failure in the first power source or the second power source and the power strip 10 does not require an additional power source for the monitoring system 17.

Figure 4:
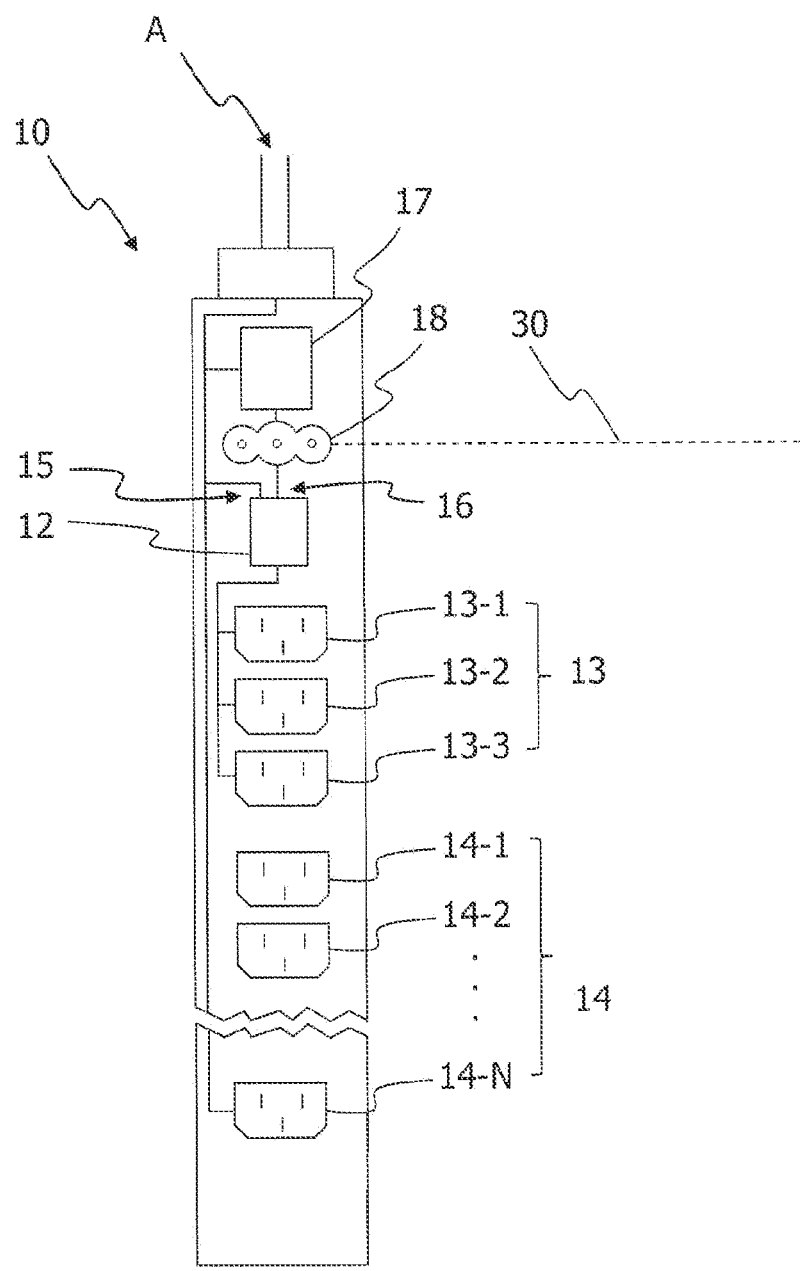
FIG. 4 is a schematic diagram of another embodiment of a power strip.

FIG. 4 illustrates another embodiment of a power strip according to the present invention. As the power strips described with reference to FIG. 1 and FIG. 3, the power strip of FIG. 4 includes first outputs 13, second outputs 14, and an automatic transfer switch 12 and may be used as a first powers trip in an electrical distribution system. For the sake of simplicity, like elements are provided with like reference numerals as used in FIG. 3. The power strip 10 according to the embodiment of FIG. 4 differs from the embodiment of FIG. 3 in that the power strip 10 further includes a locking connector 18.

As illustrated in FIG. 4, the locking connector 18 is connected to the monitoring system 17 and the second input 16 of the automatic transfer switch 12. In the embodiment of a power strip illustrated in FIG. 4, the locking connector 18 is connectable to a second power source via an interconnecting cable 30. Thereby, the locking connector 18 is able to form a secure connection between the power strip 10 and the second power source.

Figure 5:
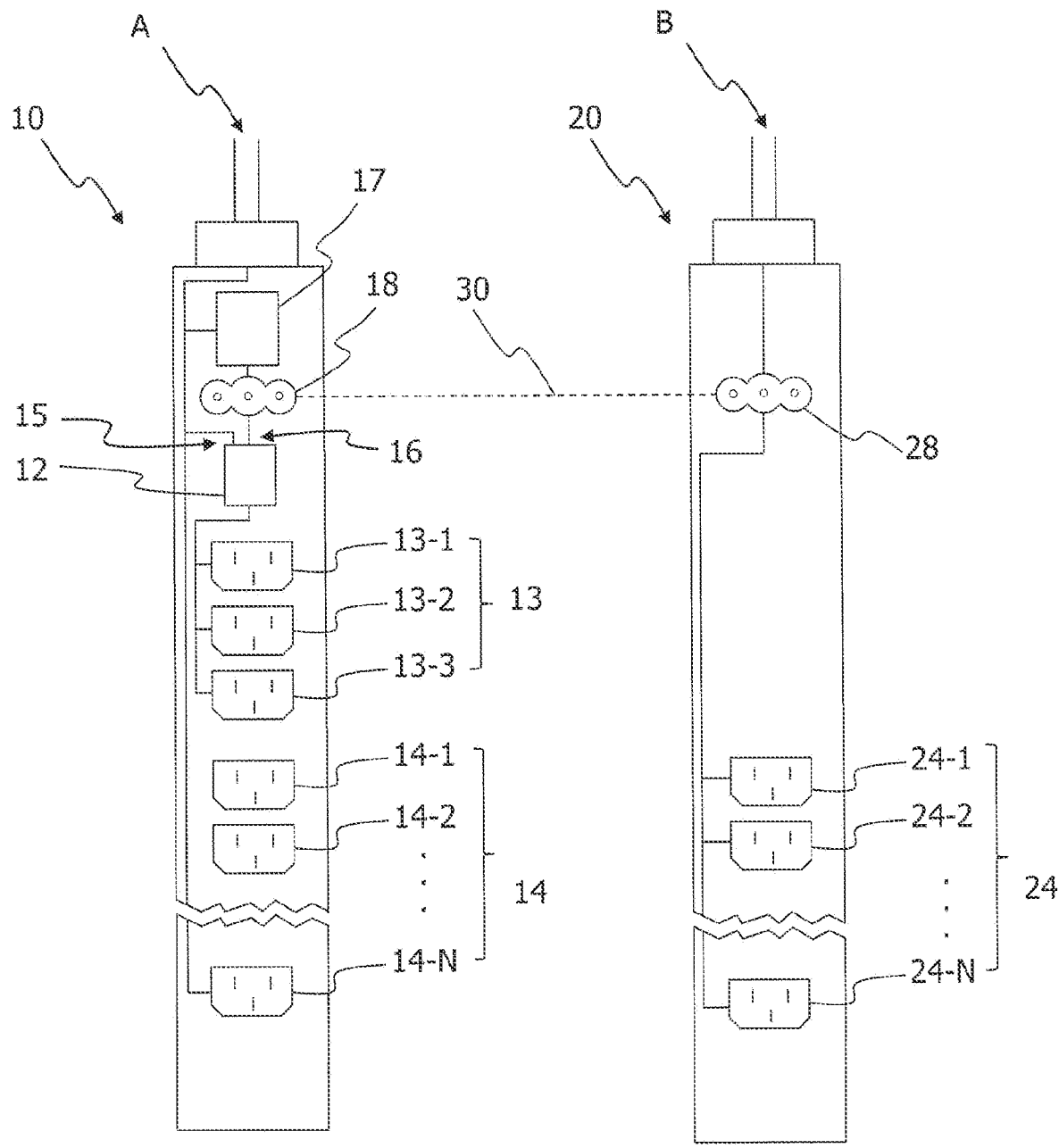
FIG. 5 is a schematic diagram of another embodiment of a system including the power strip illustrated in FIG. 4.

FIG. 5 illustrates another embodiment of a system according to the present invention including the power strip described with reference to FIG. 4. For the sake of simplicity, like elements are provided with like reference numerals as used in FIG. 4.

The system illustrated in FIG. 5 also includes a second power strip 20. The second power strip 20 in FIG. 5 is further provided with a locking connector 28 connected to the inlet B for receiving the second power. The system in FIG. 5 connects the locking connector 18 of the first power strip 10 to the locking connector 28 of the second power strip 20. Thereby, the second input 16 of the automatic transfer switch and the monitoring system 17 is provided with a secured connection with the second power strip 20, and thus a second power source, for receiving a second power.

A method of powering a plurality of devices according to the present invention includes providing a power strip as described above. The method includes connecting the first input 15 to the inlet A of the power strip 10 for receiving a first power and connecting the second input 16 to a second power source. The method further includes switching the automatic transfer switch 12 to connect one of the first input and the second input 16 to the first outputs 13. In another embodiment, the method includes a step of pre-setting and connecting one of the first input 15 and the second input 16 to the first outputs 13; and a step of switching the automatic transfer switch 12 to connect the other one of the first input 15 and the second input 16 to the first outputs 13 when there is a power failure of the power at the pre-set one of the first input 15 and the second input 16. In still another embodiment, the method further includes a step of monitoring the power at the first input 15 and the power at the second input 16; and a step of providing a notification when a voltage at the first input 15 or a voltage at the second input 16 is no longer detected.

While the present invention is disclosed by reference to the preferred embodiments and examples detailed above, it is to be understood that these examples are intended in an illustrative rather than in a limiting sense. For example, the orientations of the power strips illustrated in the figures are exemplary. The power strips may also be arranged in a different orientation, such as a vertical one, in the system. Also, the positions of the power strips and the system are not limited. While the power strips and the system are usually accommodated in a server cabinet, they can also be arranged, at least partially, outside of the server cabinet. In addition, combinations between all individual designs in the text are also possible. It will be recognized that the present invention can be varied in various ways within the scope defined by the appended claims.

The invention claimed is:

1. A power strip for receiving a first power from a first power source and distributing the received first power, comprising:
    an inlet connectable to the first power source for receiving the first power;
    one or more first outputs;
    one or more second outputs; and
    an automatic transfer switch integrated into the power strip, the automatic transfer switch including a first input and a second input, wherein:
    the one or more second outputs are connected to the inlet for receiving and outputting the first power,
    the first input of the automatic transfer switch is connected to the inlet for receiving the first power,
    the second input of the automatic transfer switch is connectable to a second power source for receiving a second power, and
    the automatic transfer switch automatically switches between the first input and the second input to connect the first input or the second input to the one or more first outputs of the power strip wherein:
    the power strip receives the first power from the first power source at a first power strip;
    a second power strip receives the second power from the second power source;
    the second power strip includes an inlet for receiving the second power and one or more third outputs connected to the inlet for outputting the second power; and
    the second input of the first power strip for receiving the first power is connected to the second power strip for receiving the second power.

2. The power strip of claim 1, wherein
one of the first input and the second input is pre-set to be connected to the one or more first outputs of the power strip by the automatic transfer switch, and
the other of the first input and the second input is connected by the automatic transfer switch to the one or more first outputs of the power strip when there is a power failure of the first or second power received by the pre-set one of the first input and the second input.

3. The power strip of claim 2, wherein
the automatic transfer switch includes a switch mechanism for automatically switching between the first and second inputs, wherein the switch mechanism automatically switches to connect the other one of the first input and the second input to the one or more first outputs of the power strip in response to the power failure of the first or second power received by the pre-set one of the first input and the second input.

4. The power strip of claim 1, further comprising a connector connected to the second input of the automatic transfer switch, wherein the second input of the automatic transfer switch is connectable to the second power source through the connector, wherein the connector is a locking connector.

5. The power strip of claim 1, further comprising:
a monitoring system connected to and powered by the first input and the second input, wherein the monitoring system is configured to monitor the first power at the first input and the second power at the second input.

6. The power strip of claim 5, wherein the monitoring system remains powered by the first input when there is a power failure of the second power and remains powered by the second input when there is a power failure of the first power.

7. The power strip of claim 5, wherein the monitoring system is configured to provide a notification when a voltage at the first input or a voltage at the second input is no longer detected by the monitoring system, and wherein:
the notification indicates a failure of the first power when the voltage at the first input is no longer detected by the monitoring system; or
the notification indicates a failure of the second power when the voltage at the second input is no longer detected by the monitoring system.

8. The power strip of claim 5, further comprising a connector connected to the second input of the automatic transfer switch and the monitoring system, wherein the second input of the automatic transfer switch is connectable to the second power source through the connector, wherein the connector is a locking connector.

9. The system of claim 1, wherein the first power strip for receiving the first power includes a first connector and the second power strip for receiving the second power includes a second connector,
wherein the first connector connects the second input of the power strip for receiving the first power to the second locking connector, and
wherein the second connector is connected to the inlet of the second power strip for receiving the second power, wherein both the first connecter and the second connector are locking connectors.

* * * * *